United States Patent [19]

Boeke et al.

[11] Patent Number: 4,615,907

[45] Date of Patent: Oct. 7, 1986

[54] PLATING POLY(ARYLENE SULFIDE) SURFACES

[75] Inventors: Paul J. Boeke; John E. Leland, both of Bartlesville, Okla.

[73] Assignee: Phillips Petroleum Company, Bartlesville, Okla.

[21] Appl. No.: 674,374

[22] Filed: Nov. 23, 1984

[51] Int. Cl.$^4$ .......................... B05D 3/06; B05D 1/18; C25D 5/00

[52] U.S. Cl. ................................. 427/53.1; 204/38.4; 427/307; 427/316; 427/322; 427/443.1; 428/457; 428/601; 428/901

[58] Field of Search ............... 427/53.1, 98, 316, 322, 427/437, 438, 305, 306, 307, 443.1; 361/397; 428/457, 601, 901; 204/38.4

[56] References Cited

U.S. PATENT DOCUMENTS

| | | | |
|---|---|---|---|
| 3,445,350 | 5/1969 | Klinger et al. | 204/30 |
| 3,516,346 | 6/1970 | Schaefer et al. | 204/157.1 X |
| 3,898,417 | 8/1975 | Atkinson | 219/121 LM |
| 4,024,038 | 5/1977 | Luc | 204/168 |
| 4,239,789 | 12/1980 | Blum et al. | 427/53.1 |
| 4,349,583 | 9/1982 | Kulynych et al. | 427/53.1 |
| 4,440,801 | 4/1984 | Aviram et al. | 427/306 X |
| 4,486,463 | 12/1984 | Rubner et al. | 427/98 X |
| 4,532,015 | 7/1985 | Boultinghouse et al. | 427/306 X |

OTHER PUBLICATIONS

*Laser Imaging of Electronic Circuitry: An Alternative to the Photomask Process,* p. 112, Insulation/Circuits, Sep., 1981.

*Primary Examiner*—Michael R. Lusignan
*Attorney, Agent, or Firm*—Stephen E. Reiter

[57] ABSTRACT

Poly(arylene sulfide) substrates are laser treated, i.e., treated with a beam of laser radiation, and then contacted with plating solution. In a specific embodiment, laser treatment imparts a specific pattern on the poly(arylene sulfide) substrate, which is then subjected to an electroless plating solution to give a printed circuit board.

14 Claims, No Drawings

PLATING POLY(ARYLENE SULFIDE) SURFACES

BACKGROUND

This invention relates to the adhesion between a poly(arylene sulfide) substrate and a coating thereon. In another aspect this invention relates to the plating of poly(arylene sulfide) substrates. In yet another aspect this invention relates to the plating of poly(arylene sulfide) substrate with a conductive metal.

Poly(arylene sulfides) are plastic materials which, due to their stability at high temperatures and resistance to various chemicals, have found ever-broadening areas of application. For some applications, it is sometimes desirable to provide a conductive metal coating on a poly(arylene sulfide) surface which displays good adhesion to the polymer surface. Such plating is useful for the production of printed circuit boards.

Printed circuit boards represent today a very substantial and rapidly growing market. They can be used, for example, in communications, instruments, controls, military, aerospace and business applications. Printed circuit boards other than copper clad laminates are typically manufactured by plating an epoxy or phenolic compound or some other heat-stable dielectric resin with a conductive metal such as, for example, copper. It is also known to plate flexible films of polyester and polyimide for this purpose. The successful production of printed circuit boards is a complex and sophisticated art that, though rapidly advancing, has yet to pass beyond the adolescence of its evolution.

Processing techniques known in the art include methods commonly identified as the subtractive method, the semiadditive method, the additive method and modifications and variations of the above. Electroless plating of the board (i.e. epoxy resin, phenolic resin, etc.) with a conductive metal is a crucial part of the overall process. After electroless deposition of a layer of the conductive metal onto the board the board is typically further plated with more of the conductive metal in accordance with conventional electroplating techniques to increase the thickness of the layer.

Absolutely essential to the success of the finished product is good adhesion of the conductive metal (which after processing represents the circuitry) to the board (i.e. epoxy resin, phenolic resin, etc.). In the absence of satisfactory adhesion the circuitry loses its structural integrity and the printed curcuit board fails to perform its intended function. Those of skill in the art seek to discover new materials which can be used in the manufacture of printed circuit boards. The challenge is to find materials which will give good adhesion and yet possess other attributes (such as, for example, high temperature resistance) that are needed in printed circuit boards.

Poly(phenylene sulfide) is a material which possesses many of these desired attributes (such as, for example, high temperature resistance) but to the limited extent it has been considered by those of skill in the art as a material suitable for printed circuit board application, it has been found that satisfactory adhesion of the conductive metal to the poly(phenylene sulfide) surface cannot be obtained by employing prior art techniques.

OBJECTS OF THE INVENTION

An object of the invention is to provide poly(arylene sulfide) substrates with improved adhesion of plating deposited thereon.

Another object of this invention is a method for plating on a poly(arylene sulfide) substrate.

These and other objects, advantages, details, features and embodiments of this invention will become apparent to those skilled in the art from the following detailed description of the invention and the appended claims.

STATEMENT OF THE INVENTION

In accordance with the present invention, we have discovered that the adhesion of plating on poly(arylene sulfide) surfaces is significantly increased by subjecting the plastic surface to laser treatment prior to contacting the poly(arylene sulfide) surface with a plating solution.

DETAILED DESCRIPTION OF THE INVENTION

Thus, in accordance with the invention, a plating is applied to a poly(arylene sulfide) substrate by (i) laser treating, i.e. contacting at least one surface of the poly(arylene sulfide) substrate with a beam of laser radiation, then (ii) contacting the laser treated substrate with a plating solution. The poly(arylene sulfide) substrate may optionally be subjected to a surface treatment step either prior to, or after, the laser treatment.

In a preferred embodiment of the invention, the laser treatment is carried out in a defined pattern upon the poly(arylene sulfide) substrate, and the plating solution is an electroless plating solution. The resulting product is useful, for example, as a printed circuit board.

POLY(ARYLENE SULFIDE)

The substrate, for purposes of this invention, is a poly(arylene sulfide) article such as for example a board, sheet, block, plate, disc, or the like. Where the substrate employed is in the shape of a board, it is preferably an injection molded board with molded-in holes, useful, for example, for construction of printed circuit boards. Poly(arylene sulfide) is used herein to designate arylene sulfide polymers.

Without being limited thereto, uncured or partially cured poly(arylene sulfide) whether homopolymer, copolymer, terpolymer, and the like, or a blend of such polymers, can be used in the practice of the invention. The uncured or partially cured polymer is a polymer the molecular weight of which can be increased by either lengthening of a molecular chain or by crosslinking or by combination of both by supplying thereto sufficient energy, such as heat. Suitable poly(arylene sulfide) polymers include, but are not limited to, those described in U.S. Pat. No. 3,354,129, incorporated by reference herein. Examples of poly(arylene sulfide) polymers suitable for purposes of the invention include poly(2,4-tolylene sulfide), poly(4,4'-biphenylene sulfide) and poly(phenylene sulfide). Because of its availability and desirable properties (such as high chemical resistance, nonflammability, and high strength and hardness) poly(phenylene sulfide) is the presently preferred poly(arylene sulfide). Various poly(arylene sulfides) are commercially available under the trademark Ryton ® from Phillips Petroleum Company, Bartlesville, Okla.

FILLERS

Various fillers can be used in the compositions useful for the practice of this invention. Typical fillers include fiberglass, talc, mica, silica, calcium carbonate and calcium sulfate. Most preferably the compositions used in the practice of this invention contain fiberglass and one or more of the above-mentioned fillers.

Although not required for the practice of the present invention, additional composition components may include mercaptosilanes, processing aids (e.g. mold release agents), corrosion inhibitors, stabilizers and the like.

OTHER ADDITIVES

Polyethylene and zinc stearate are examples of useful mold release agents. An example of a corrosion inhibitor is lithium carbonate.

LASER TREATMENT

Good adhesion requires careful preparation of the poly(arylene sulfide) substrate prior to the plating operation. This preparation entails treating the normally smooth poly(arylene sulfide) substrate surface to create a water-wettable, i.e., coarser, rougher, more uneven or more irregular surface. In accordance with the practice of this invention, this is accomplished by laser treating, i.e. contacting at least one surface of the poly(arylene sulfide) substrate with a beam of laser radiation prior to contacting the substrate with a plating solution. Optionally, the substrate may be subjected to additional treatment, such as for example chemical and/or physical alteration of the substrate surface. Such optional, additional surface treatment may be carried out before or after laser treatment, but it is advantageously performed prior to contacting the substrate with plating solution.

In accordance with the invention, a poly(arylene sulfide) substrate is exposed to laser radiation such as to change the irradiated surface as compared to the non-irradiated surface. In many applications, it is desirable to expose the substrate to laser radiation in a defined pattern so that exposure to a plating solution will produce a plated product with defined characteristics such as for example, the circuitry required for a printed circuit board. The desired pattern can be generated in a variety of ways, such as for example by passing the laser radiation through a stencil, by causing finely focused laser radiation to trace a predetermined pattern on the substrate, by protecting a portion of the substrate with a laser-resistant mask, which is then removed after exposure to laser radiation, and the like.

The laser energy and exposure time required for the inventive surface treatment can be readily determined by those skilled in the art. Broadly, the minimum level of laser energy is that which, in a given exposure time, produces a water-wettable surface. Thus, a high energy laser for short exposure time or a lower energy laser for a more extended exposure time may be employed. Multiple laser pulses are also within the scope of the invention.

The poly(arylene sulfide) substrate is exposed to an intensity of laser radiation which is sufficient to render the substrate surface water-wettable. Although the poly(arylene sulfide) substrate can be subjected to a wide-range of laser intensities, it is desirable that the intensity of laser radiation not exceed that amount of energy which causes degradation of the polymer surface. Suitable laser intensities range from about $1 \times 10^8$ joules/sec/cm$^2$ up to about $5 \times 10^9$ joules/sec/cm$^2$. Any combination of laser energy and exposure time which provides an intensity within the above range may be employed. Those of skill in the art recognize that lasers capable of producing a wide range of energies are available. In addition, laser energy output can be amplified or reduced, as desired, by the use of filters, lenses and the like. As indicated above, relatively longer exposure times are appropriate where lower laser energies are employed, whereas relatively shorter exposure times are required when higher laser energies are employed.

In addition to laser treatment as detailed above, the poly(arylene sulfide) substrate may optionally be chemically and/or physically treated to further alter the substrate surface, thereby rendering it even more conducive to treatment with plating solution. Chemical etchants, grit blasting, mechanical abrading, flame treating and the like can be used for this purpose.

Poly(arylene sulfide) polymers such as poly(phenylene sulfide) polymers are well known for their strong chemical resistance. This strong chemical resistance makes selection of an effective chemical etchant very important. A strong oxidizing agent such as nitric acid alone or, even more advantageously, in combination with hydrofluoric acid can be used as the chemical etchant.

Grit blasting, when employed, can be followed by ultrasonic cleaning to remove particles from the surface.

Flame treatment of the poly(arylene sulfide) surface can also be employed to modify the substrate surface. One suitable flame treatment method involves passing a 10% excess of air-to-methane oxidizing flame over the surface for a time sufficient to alter the surface characteristics as confirmed by reduction or elimination of beading of a water drop on the surface.

PLATING TREATMENT

In accordance with the invention, the treated poly(arylene sulfide) substrate is contacted with a plating solution such as for example, an electroless plating solution, a spray of finely divided plating material, a stream of plating material in a vacuum or the like.

In accordance with a specific embodiment of this invention, a printed circuit board is produced by electroless plating of a conductive metal such as, for example, copper onto a laser treated poly(arylene sulfide) board. The electroless plating step can be followed by an electroplating step to deposit more conductive metal onto the board.

Various techniques can be used to create the circuitry on the board. Subtractive methods can be used to remove undesired conductive metal from the plated board thus leaving the remaining conductive metal in the form and shape needed to define the desired circuitry. Additive methods can be used such that the conductive metal is plated only onto preselected portions of the board thus creating the desired circuitry upon deposition. These circuitry-creating techniques and modifications and variations thereof are known in the art and can be readily adapted to produce the printed circuit boards of this invention. This invention can also be practiced in combination with other circuitry-creating techniques yet to be developed or commonly practiced.

Electroless plating, also known as autocatalytic plating, is commonly defined as the deposition of a metallic plating or film onto a substrate by the interaction in solution of a metal salt and a chemical reducing agent, whereby this chemical reduction is catalyzed by the metal or alloy being deposited. In the practice of this invention the electroless metal can be any conductive metal capable of being used in an electroless plating operation. Copper and nickel are two such metals, each being especially well suited for this purpose. The term conductive metal is intended to include conductive alloys.

A catalyst is usually needed to initiate the electroless deposition process. The poly(arylene sulfide) board can be treated with the catalyst, for example a palladium-tin catalyst, prior to the electroless plating operation. Note that the need for the catalyst is short-lived since once initiated the electroless process is autocatalytic, i.e. catalyzed by the conductive metal (e.g. copper, nickel, etc.) deposited on the polymer surface.

The electroless plating operation itself can be conducted in a bath-containing tank. Preferably the tank is made of plastic or lined with plastic or made of passivated stainless steel to prevent plating of the tank itself. The electroless plating bath contains (typically in solution) the conductive metal (e.g. copper, nickel, etc.) to be deposited on the poly(arylene sulfide) board. The electroless plating operation can be carried out in accordance with conventional electroless plating methods and techniques.

Persons of skill in the relevant art possess sufficient knowledge of electroless plating that, when coupled with this disclosure, will enable them to practice this invention. More detailed and complete information concerning electroless plating is readily available to those who seek it.

Electroless plating is a relatively slow process in that it requires a relatively long time to build up a sufficiently thick deposit of conductive metal on the poly(arylene sulfide) board. For this reason it is preferred to terminate the electroless plating operation after the deposited conductive metal has obtained a thickness of at least about 20 microns and to use electroplating to supply the desired additional conductive metal. The thin deposit of conductive metal deposited during the electroless plating operation is referred to as an electroless film. The electroless film serves two purposes. First, it provides the poly(arylene sulfide) board with an electrically conductive surface needed to allow further deposition of conductive metal by electroplating. Secondly, the electroless film creates a bond between the poly(arylene sulfide) board and the electroplated conductive metal.

Electroplating is essentially the electrodeposition of an adherent metallic plating onto an electrode. This invention can be successfully practiced by employing conventional electroplating methods and apparatus. Typically, the poly(arylene sulfide) board having the electroless film can be positioned in a tank containing a plating solution (usually aqueous). The plating solution provides ions of the conductive metal to be deposited.

The conductive metal can be any conductive metal capable of being electroplated onto the electroless film coated poly(arylene sulfide) board. Examples of such metals include, but are not limited to, copper and nickel. The term conductive metal is intended to include conductive alloys. The conductive metal need not be the same metal of which the electroless film is comprised.

Persons of skill in the relevant art possess sufficient knowledge of electroplating such that this knowledge coupled with this disclosure will enable them to practice this invention. More detailed and complete information concerning electoplating is readily available to those who seek it.

The electroplating operation continues until the desired total amount of conductive metal has been deposited. The thickness of the total amount of conductive metal deposited (by both the electroless plating and electroplating operations) onto the poly(arylene sulfide) board will depend upon the intended application of the product (i.e. the printed circuit board). Typically, this thickness will be within the range of about 1 mil to about 4 mils.

The strength of the adhesion between the conductive metal and the poly(arylene sulfide) board is of crucial importance to the successful manufacture of the printed circuit board. If the adhesion strength is too low the detailed circuitry (which is comprised of the conductive metal) cannot maintain its structural integrity and the printed circuit board is useless for practical application. For this reason it is absolutely essential that the adhesion between the conductive metal and the poly(arylene sulfide) board be sufficiently strong to withstand the rigors to which printed circuit boards are typically subjected. This adhesion strength is commonly referred to, and measured in terms of, peel strength. To be useful at all for practical applications the printed circuit board must have sufficient metal to board adhesion strength such that the peel strength is at least about 4 pounds per inch. A good product, however, will be characterized by a peel strength of at least about 5 pounds per inch and preferably at least about 6 pounds per inch. In some instances, experiments conducted in accordance with this invention have yielded plated poly(arylene sulfide) boards having outstanding peel strengths of above 7 and even above 8 pounds per inch. The above peel strengths reflect values as measured in accordance with ASTM Test Method Part 9 B533-79 Procedure A which is the ASTM test for peel strength of metal-electroplated plastics. For the purposes of this disclosure and the appended claims this ASTM test method is modified to the extent that the test procedure is carried out irrespective of the thickness of the metallic coating.

The following example is given to facilitate a full and complete disclosure of this invention.

EXAMPLE

The following poly(phenylene sulfide) compositions were laser treated by (1) a yttrium, aluminum, garnet (YAG) pulsed laser having an output of 20 microwatts at a $10^9$ frequency at Photonic Inc., Florida. Other laser data comprises a 1 to 1 ratio having a distance of the laser to the focal point of 12 inches Cl and a distance from the focal point to the article being exposed varying from 6 inches to 10 inches, or (2) a $CO_2$ laser with an output of about 3 joules, pulsed to fire about 12 times/sec. The output per pulse is about 2.1 joules/500 nanoseconds. Each pulse was focussed on an 0.25 inch by 0.35 inch rectangle. A control substrate of each composition had no laser treating prior to plating. Where additional surface treatment was employed, poly(arylene sulfide) surfaces were flame treated or chemically etched prior to the combination of electroless and electroplating being used to plate the substrate. The chemical etch consisted of immersing the substrate in a bath of 65 g ammonium bifluoride in 455 mL of concentrated aqueous nitric acid maintained at 111° F. for about 3 to about 10 minutes. As indicated in the Table which follows, the etch bath can be maintained at a different temperature and varied exposure time can be employed.

The first composition comprises Ryton ® R-7 which is a polyphenylene sulfide composition containing mineral fillers sold by Phillips Petroleum Company in Bartlesville, Okla.

A second composition, Ryton ® R-4 (polyphenylene sulfide with fiberglass fillers), was also electroless plated and tested.

Finally, a Ryton ® R-10 composition (polyphenylene sulfide with mineral fillers and pigments) and Ryton ® BR-58 (an experimental composition of polyphenylene sulfide with fillers) were tested.

TABLE I

| Run No. | Compound | Laser Treatment | | | Chem. Etch Time, min./ Temp., F. | Peel Str. lbs./in. |
| --- | --- | --- | --- | --- | --- | --- |
| | | None | $CO_2$ | YAG | | |
| 1 | R-4 | X | | | None | 0 |
| 2 | | | X | | | 1-2 |
| 3 | R-4 | X | | | 1.5/112 | 1 |
| 4 | | | X | | | 8 |
| 5 | R-4 | X | | | 10/75 | <1 |
| 6 | | | X | | | 5 |
| 7 | R-7 | X | | | None | 1.5 |
| 8 | | | X | | | 3.5 |
| 9 | R-7 | X | | | 1.5/112 | 2 |
| 10 | | | X | | | 4-8 |
| 11 | R-7 | X | | | None | 0 |
| 12 | | | | X | | 2.8 |
| 13 | R-10 | X | | | None | <1 |
| 14 | | | X | | | 1-2 |
| 15 | R-10 | X | | | 5/75 | 2 |
| 16 | | | X | | | 5.5 |
| 17 | BR-58 | X | | | None | 0 |
| 18 | | | | X | | 2.2 |

The results of these experiments demonstrate that laser treated poly(arylene sulfide) substrate, in all cases, has a higher peel strength than non-laser treated substrate. Where the substrate has been chemically etched also, the peel strength measured are significantly improved by laser treatment compared to chemical etch alone.

The examples have been provided merely to illustrate the practice of our invention and should not be read so as to limit the scope of our invention or the appended claims in any way. Reasonable variation and modification, not departing from the essence and spirit of our invention, are contemplated to be within the scope of patent protection desired and sought.

We claim:

1. A method for plating a poly(arylene sulfide) substrate comprising:
   (a) contacting at least one surface of said poly(arylene sulfide) substrate with a beam of laser radiation of sufficient intensity to render the surface of the substrate water-wettable, and
   (b) contacting the laser treated poly(arylene sulfide) substrate with a plating solution.

2. A method according to claim 1 wherein said beam of laser radiation has an intensity of at least $1 \times 10^8$ joules/sec/cm$^2$ up to about $5 \times 10^9$ joules/sec/cm$^2$.

3. A method according to claim 1 wherein said poly(arylene sulfide) substrate is a poly(phenylene sulfide) substrate.

4. A method according to claim 3 wherein said poly(phenylene sulfide) substrate further comprises filler.

5. A method according to claim 4 wherein said filler is selected from the group consisting of:
   glass,
   talc,
   titanium dioxide,
   silica,
   calcium carbonate, and
   calcium sulfate.

6. A method according to claim 1 wherein said plating is applied in a defined pattern.

7. A method according to claim 6 wherein said defined pattern is imparted by contacting said poly(arylene sulfide) substrate with a beam of laser radiation in a defined pattern.

8. A method according to claim 6 wherein said defined pattern is imparted by contacting said poly(arylene sulfide) substrate with a beam of laser radiation through a mask.

9. A method according to claim 1 wherein said plating solution is an electroless plating solution.

10. A method according to claim 9 further comprising:
    (c) subjecting the laser treated poly(arylene sulfide) which has been contacted with an electroless plating solution to electroplating conditions.

11. A method according to claim 1 wherein said plating solution is a spray of finely divided plating material.

12. A method according to claim 1 wherein said poly(arylene sulfide) substrate is contacted with said plating solution in a vacuum.

13. A method according to claim 1 further comprising subjecting said poly(arylene sulfide) substrate to a surface treatment step prior to said contacting with a beam of laser radiation; wherein said surface treatment step comprises one or more of the following:
    acid etching,
    grit blasting,
    flame treating,
    and combination of any two or more thereof.

14. A method according to claim 1 further comprising subjecting said poly(arylene sulfide) substrate to a surface treatment step prior to said contacting with a plating solution, but after said contacting with a beam of laser radiation;
    wherein said surface treatment step comprises one or more of the following:
    acid etching,
    grit blasting,
    flame treating,
    and combination of any two or more thereof.

* * * * *